(12) United States Patent
Nakanishi (10) Patent No.: US 7,728,410 B2
(45) Date of Patent: Jun. 1, 2010

(54) SEMICONDUCTOR DEVICE COMPRISING LIGHT-BLOCKING REGION ENCLOSING SEMICONDUCTOR ELEMENT

(75) Inventor: Hiroyuki Nakanishi, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 955 days.

(21) Appl. No.: 11/399,490

(22) Filed: Apr. 7, 2006

(65) Prior Publication Data

US 2006/0231855 A1 Oct. 19, 2006

(30) Foreign Application Priority Data

Apr. 14, 2005 (JP) ............................. 2005-117001

(51) Int. Cl.
*H01L 23/552* (2006.01)
(52) U.S. Cl. .................. 257/659; 257/99; 257/758; 257/E23.114; 257/E23.151
(58) Field of Classification Search ............... 257/99, 257/659, 758, E23.114, E23.151
See application file for complete search history.

(56) References Cited

U.S. PATENT DOCUMENTS

| 6,479,342 | B1 | 11/2002 | Inaba | |
|---|---|---|---|---|
| 6,489,067 | B2 * | 12/2002 | Soenosawa | 430/5 |
| 7,126,175 | B2 * | 10/2006 | Inoue et al. | 257/294 |
| 7,253,462 | B2 * | 8/2007 | Inoue et al. | 257/294 |
| 7,304,337 | B2 * | 12/2007 | Inoue et al. | 257/290 |

FOREIGN PATENT DOCUMENTS

| JP | A 2000-286383 | 10/2000 |
|---|---|---|
| JP | 2003124363 A * | 4/2003 |

\* cited by examiner

*Primary Examiner*—Andy Huynh
(74) *Attorney, Agent, or Firm*—Oliff & Berridge, PLC (57) ABSTRACT

A semiconductor device includes a semiconductor element, a light-blocking region enclosing the semiconductor element, a plurality of contacts disposed in a staggered arrangement in a first region of the light-blocking region, and a linear contact formed to extend along at least a first direction in a second region of the light-blocking region differing from the first region.

14 Claims, 12 Drawing Sheets

SEMICONDUCTOR DEVICE COMPRISING LIGHT-BLOCKING REGION ENCLOSING SEMICONDUCTOR ELEMENT

Japanese Patent Application No. 2005-117001 filed on Apr. 14, 2005, is hereby incorporated by reference in its entirety.

BACKGROUND OF THE INVENTION

The present invention relates to a semiconductor device including a semiconductor element which may change in characteristics due to the effects of light.

As examples of a semiconductor element which may change in characteristics due to the effects of light, a metal-oxide-semiconductor (MOS) transistor, a nonvolatile memory including a floating gate, and the like can be given (JP-A-2000-286383). The characteristics of these semiconductor elements may change due to the effects of light. For example, the ON/OFF characteristics of the MOS transistor may change, or electric charges injected into the floating gate of the nonvolatile memory may be removed. In particular, the effects of light must be taken into consideration when a chip is mounted by a COG mounting method or the like (e.g. bare chip).

In order to prevent such a change in characteristics of the semiconductor element, a light-blocking layer for blocking light is provided over the semiconductor element.

However, while the light-blocking layer can block light entering from the upper side of the semiconductor element, it is difficult for the light-blocking layer to block light entering in the direction parallel to the formation surface of the semiconductor element. In order to minimize the amount of light entering in the horizontal direction, a light-blocking material (e.g. metal interconnect) having a light-blocking area sufficiently greater than the area of the formation region of the semiconductor element must be provided in the light-blocking layer. This prevents efficient utilization of the chip area, whereby a reduction in cost is hindered.

SUMMARY

One aspect of the invention relates to a semiconductor device comprising: a semiconductor element; a light-blocking region enclosing the semiconductor element; a plurality of contacts disposed in a staggered arrangement in a first region of the light-blocking region; and a linear contact formed to extend along at least a first direction in a second region of the light-blocking region differing from the first region.

DETAILED DESCRIPTION OF THE EMBODIMENT

The invention may provide a semiconductor device having a light-blocking structure with excellent light-blocking efficiency.

One embodiment of the invention relates to a semiconductor device comprising: a semiconductor element; a light-blocking region enclosing the semiconductor element; a plurality of contacts disposed in a staggered arrangement in a first region of the light-blocking region; and a linear contact formed to extend along at least a first direction in a second region of the light-blocking region differing from the first region.

This enables the area of the light-blocking region to be reduced without decreasing the light-blocking efficiency, whereby the circuit area of the semiconductor device can be reduced. Specifically, the manufacturing cost can be reduced.

In this embodiment, a first signal line pull-out region for forming a first signal line connected with the semiconductor element and a second signal line pull-out region for forming a second signal line connected with the semiconductor element may be formed in the light-blocking region; and the first region in which the contacts are disposed in a staggered arrangement may be provided between the first signal line pull-out region and the second signal line pull-out region.

This enables the first region in which the contacts are disposed in a staggered arrangement to be provided between the first and second signal line pull-out regions, whereby a decrease in the light-blocking efficiency can be prevented even if the first and second signal lines are formed.

In this embodiment, the first signal line pull-out region or the second signal line pull-out region may be provided in a region between the first region and the second region.

In this embodiment, a width of the second region in the first direction may be greater than a width of the first region in the first direction.

In this embodiment, a staggered contact formation region in which a plurality of contacts are disposed in a staggered arrangement may be provided on an end of the second region.

This enables the light-blocking efficiency in the area in which the linear contact is not formed to be improved on the end of the second region.

In this embodiment, the semiconductor device may comprise: a plurality of via contacts formed in an upper layer of the contacts in the first region, and a linear via contact formed to extend along the first direction in an upper layer of the linear contact in the second region; and the via contacts may be disposed in a staggered arrangement in the first region.

This enables the light-blocking efficiency in the first and second regions to be improved.

In this embodiment, a first light-blocking metal interconnect may be formed in the first and second regions in a first metal interconnect layer which is the upper layer of the contacts and the linear contact and is a lower layer of the via contacts and the linear via contact.

This enables the light-blocking efficiency in the first and second regions to be improved.

In this embodiment, a second light-blocking metal interconnect may be formed in a second metal interconnect layer in an upper layer of the via contacts in the first region; and a linear via contact may be formed in an upper layer of the second light-blocking metal interconnect in the first region.

This enables the light-blocking efficiency in the first region to be improved.

In this embodiment, a second light-blocking metal interconnect may be formed in the second region in a second metal interconnect layer in an upper layer of the linear via contact; and the linear via contact may be formed in an upper layer of the second light-blocking metal interconnect.

This enables the light-blocking efficiency in the second region to be improved.

In this embodiment, the first and second signal lines connected with the semiconductor element may be formed in the first metal interconnect layer and may not be electrically connected with the first light-blocking metal interconnect.

This enables the first and second signal lines to be formed in the first metal interconnect layer.

In this embodiment, a staggered via contact formation region in which the via contacts are disposed in a staggered arrangement may be provided on an end of the second region.

This enables the light-blocking efficiency in the area in which the linear via contact is not formed to be improved on the end of the second region.

In this embodiment, a third signal line pull-out region for forming a third signal line connected with the semiconductor element and a fourth signal line pull-out region for forming a fourth signal line connected with the semiconductor element may be formed in the light-blocking region; and a third region in which the linear contact is formed may be provided between the third signal line pull-out region and the fourth signal line pull-out region.

This enables the light-blocking efficiency in the third region between the third and fourth signal line pull-out regions to be improved.

In this embodiment, a first light-blocking metal interconnect may be formed in a first metal interconnect layer in an upper layer of the linear contact in the third region; and the via contacts may be disposed in a staggered arrangement in an upper layer of the first light-blocking metal interconnect in the third region.

This enables the light-blocking efficiency in the third region to be improved.

In this embodiment, a second light-blocking metal interconnect may be formed in a second metal interconnect layer in an upper layer of the via contacts in the third region; and via contacts may be disposed in a staggered arrangement in an upper layer of the second light-blocking metal interconnect in the third region.

This enables the light-blocking efficiency in the third region to be improved.

In this embodiment, the third and fourth signal lines may be formed in the second metal interconnect layer and may not be electrically connected with the second light-blocking metal interconnect.

This enables the third and fourth signal lines to be formed in the second metal interconnect layer.

One embodiment of the invention is described below with reference to the drawings. Note that the embodiment described below does not in any way limit the scope of the invention laid out in the claims. Note that all elements of the embodiment described below should not necessarily be taken as essential requirements for the invention. In the drawings, sections indicated by the same symbols have the same meanings.

1. Semiconductor Device

Figure 1:
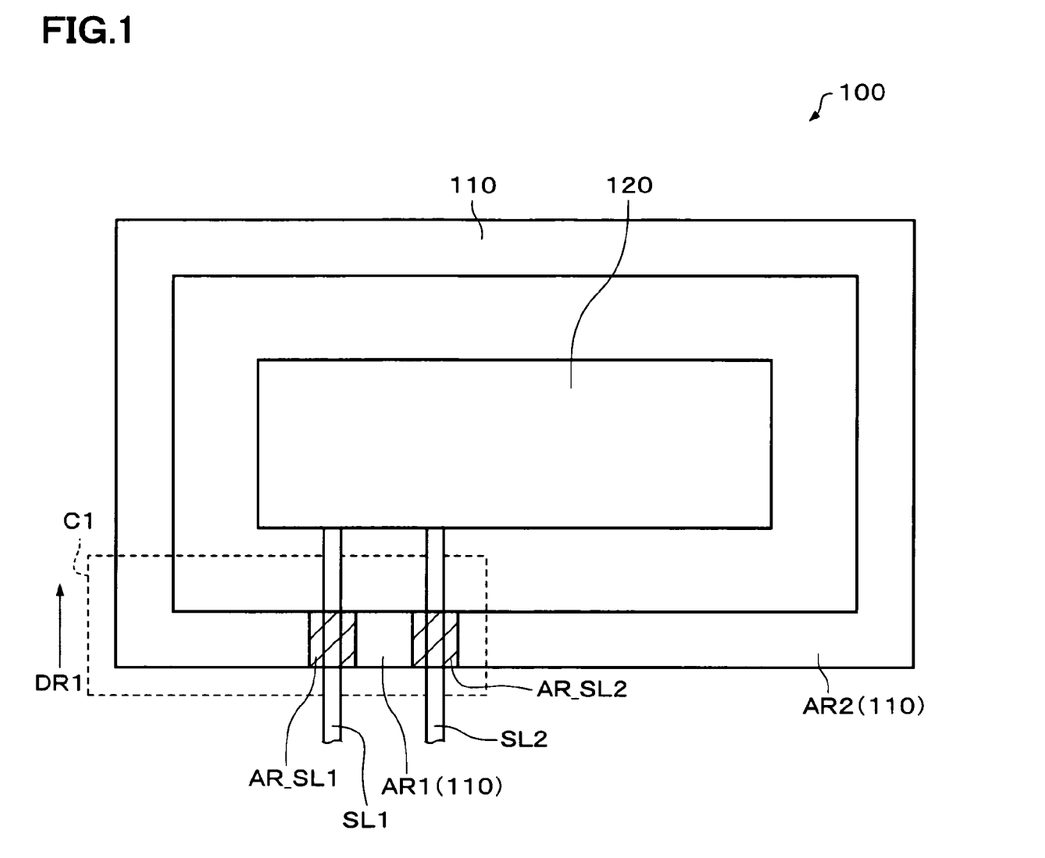
FIG. 1 is a configuration example of a semiconductor device according to one embodiment of the invention.

FIG. 1 is a diagram showing a configuration example of a semiconductor device 100 according to this embodiment. The semiconductor device 100 includes a semiconductor element 120 and a light-blocking region 110 enclosing the semiconductor element 120. A first signal line SL1 and a second signal line SL2 are connected with the semiconductor element 120. The light-blocking region 110 includes a first region AR1, a second region AR2, a first signal line pull-out region AR_SL1, and a second signal line pull-out region AR_SL2. A plurality of contacts CNT (see FIG. 2) are disposed in the first region AR1 in a staggered arrangement. A linear contact DCNT (see FIG. 2) is formed in the second region AR2. The first signal line pull-out region AR_SL1 is a region for pulling out a first signal line SL1 connected with the semiconductor element 120, for example. Likewise, the second signal line pull-out region AR_SL2 is a region for pulling out a second signal line SL2 connected with the semiconductor element 120, for example.

The linear contact DCNT is a contact formed to extend in the longitudinal direction along a direction DR1 (first direction in a broad sense), for example. The semiconductor device 100 according to this embodiment is not limited to the above-described configuration. For example, the second signal line SL2 may be omitted.

Figure 2:
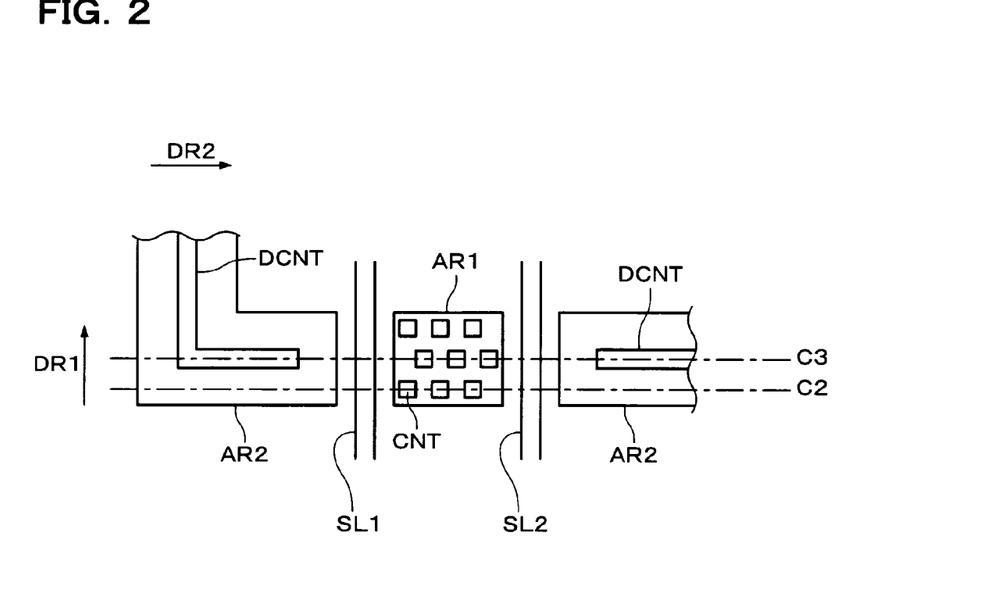
FIG. 2 is a diagram showing a part of the semiconductor device according to one embodiment of the invention.

FIG. 2 is a diagram showing the details of an area C1 shown in FIG. 1. As shown in FIG. 2, the contacts CNT are disposed in the first region AR1 in a staggered arrangement. The linear contact DCNT is formed in the second region AR2. The linear contact DCNT is formed to extend along the direction DR1 or DR2. As shown in FIG. 2, the linear contact DCNT may be formed in the shape of the letter "L" so that a part of the linear contact DCNT extends along the direction DR1 and the remaining portion extends along the direction DR2.

Figure 3:
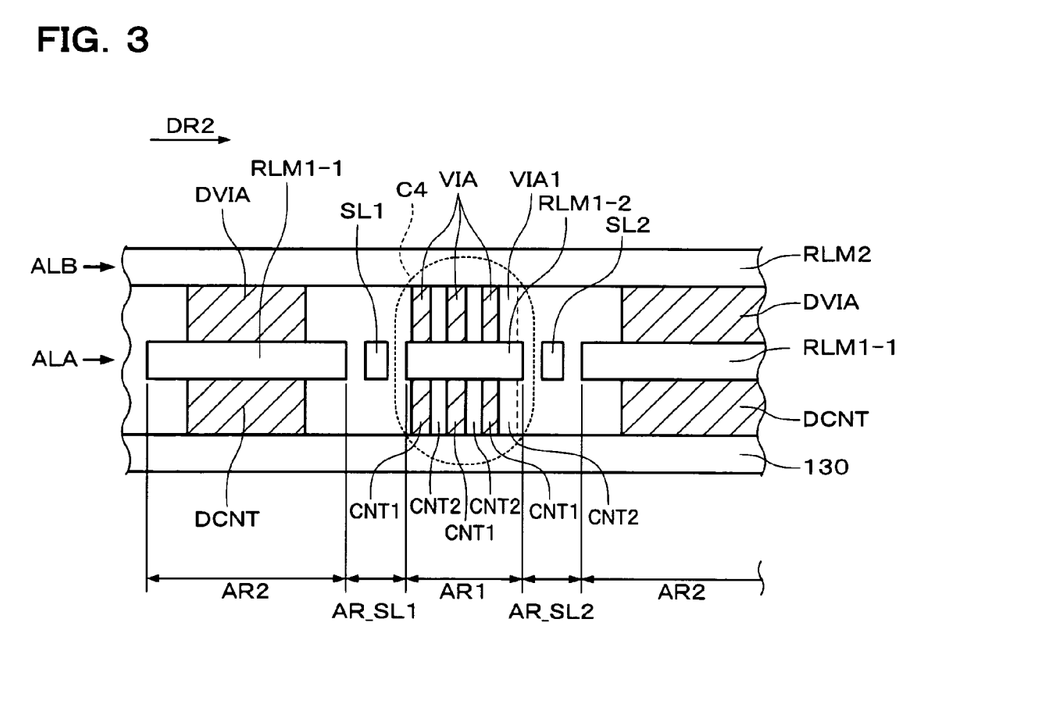
FIG. 3 is another diagram showing a part of the semiconductor device according to one embodiment of the invention.

FIG. 3 is a side view of the area of the semiconductor device 100 shown in FIG. 2 in the direction DR1. FIG. 3 shows the cross sections of the signal lines SL1 and SL2. The linear contact DCNT and the contacts CNT are formed in the upper layer of a substrate 130. In more detail, the contacts CNT are formed in the first region AR1 on the substrate 130, and the linear contact DCNT is formed in the second region AR2 on the substrate 130. A contact CNT1 shown in FIG. 3 indicates the contact CNT on a line C2 shown in FIG. 2, and a contact CNT2 shown in FIG. 3 indicates the contact CNT on a line C3 shown in FIG. 2.

A light-blocking metal interconnect RLM1-2 (first light-blocking metal interconnect in a broad sense) is formed in a first metal interconnect layer ALA in the first region AR1. A plurality of via contacts VIA are formed in the upper layer of the first metal interconnect layer ALA in the first region AR1. The via contacts VIA are disposed in a staggered arrangement in the same manner as the contacts CNT shown in FIG. 2. A light-blocking metal interconnect RLM2 (second light-blocking metal interconnect in a broad sense) is formed in a second metal interconnect layer ALB in the first region AR1. A via contact VIA1 shown in FIG. 3 indicates the via contact VIA on the line C3 shown in FIG. 2.

Since the contacts CNT and the via contacts VIA are formed in the first region AR1 between the first and second signal line pull-out regions AR_SL1 and AR_SL2, as indicated by C4 shown in FIG. 3, the light-blocking properties n the area indicated by C4 can be improved, whereby the light-blocking efficiency can be improved.

A light-blocking metal interconnect RLM1-1 (first light-blocking metal interconnect in a broad sense) is formed in the first metal interconnect layer ALA in the second region AR2. A linear via contact DVIA is formed in the upper layer of the first metal interconnect layer ALA in the second region AR2. A light-blocking metal interconnect RLM2 is formed in the second metal interconnect layer ALB in the upper layer of the linear via contact DVIA in the second region AR2.

The linear via contact DVIA shown in FIG. 3 is not formed on the line C3 shown in FIG. 2, but is formed at a position which does not overlap the position at which the linear contact DCNT is formed. This is based on the design rule space.

The first signal line SL1 is formed in the first metal interconnect layer ALA in the first signal line pull-out region AR_SL1, for example. The second signal line SL2 is formed in the first metal interconnect layer ALA in the second signal line pull-out region AR_SL2, for example.

Since the contacts CNT and the via contacts VIA are formed in the first region AR1, as indicated by C4 in FIG. 3, the pull-out regions AR_SL1 and AR_SL2 for the signal lines SL1 and SL2 can be provided while minimizing a decrease in the light-blocking properties.

The light-blocking metal interconnect RLM1-1 and the like are formed of aluminum, for example. Note that the material for the light-blocking metal interconnect RLM1-1 and the like is not limited to aluminum. It suffices that the material be a metal exhibiting light-blocking properties.

Figure 4:
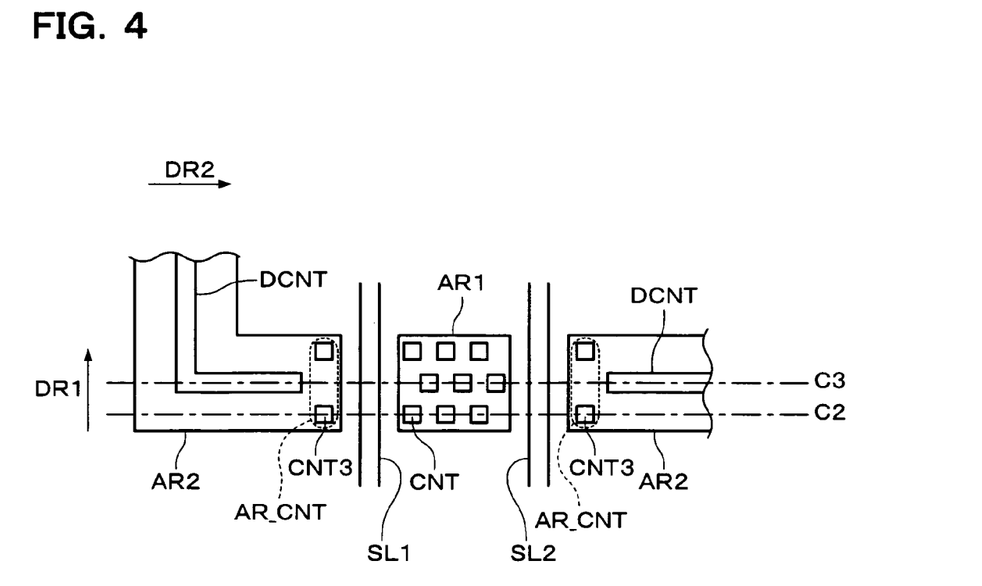
FIG. 4 is a diagram showing a modification according to one embodiment of the invention.

FIG. 4 is a diagram showing a modification according to this embodiment. In the modification according to this embodiment, a staggered contact formation region AR_CNT is provided in the second region AR2 shown in FIG. 2. A plurality of contacts CNT3 are formed in the staggered contact formation region AR_CNT. FIG. 4 shows two contacts CNT3. Note that the number of contacts CNT3 is not limited to two. A plurality of contacts CNT3 may be formed in the staggered contact formation region AR_CNT in a staggered arrangement.

The staggered contact formation region AR_CNT is formed in the end region of the second region AR2 in the direction in which the linear contact DCNT extends. The staggered contact formation region AR_CNT may be formed in the region between the signal line pull-out region AR_SL1 or AR_SL2 and the region in which the linear contact DCNT is formed.

A staggered via contact formation region may be provided in the same region as the staggered contact formation region AR_CNT. In this case, a plurality of via contacts VIA may be provided in the staggered via contact formation region. The via contacts VIA may be provided in the staggered via contact formation region in a staggered arrangement.

Figure 5:
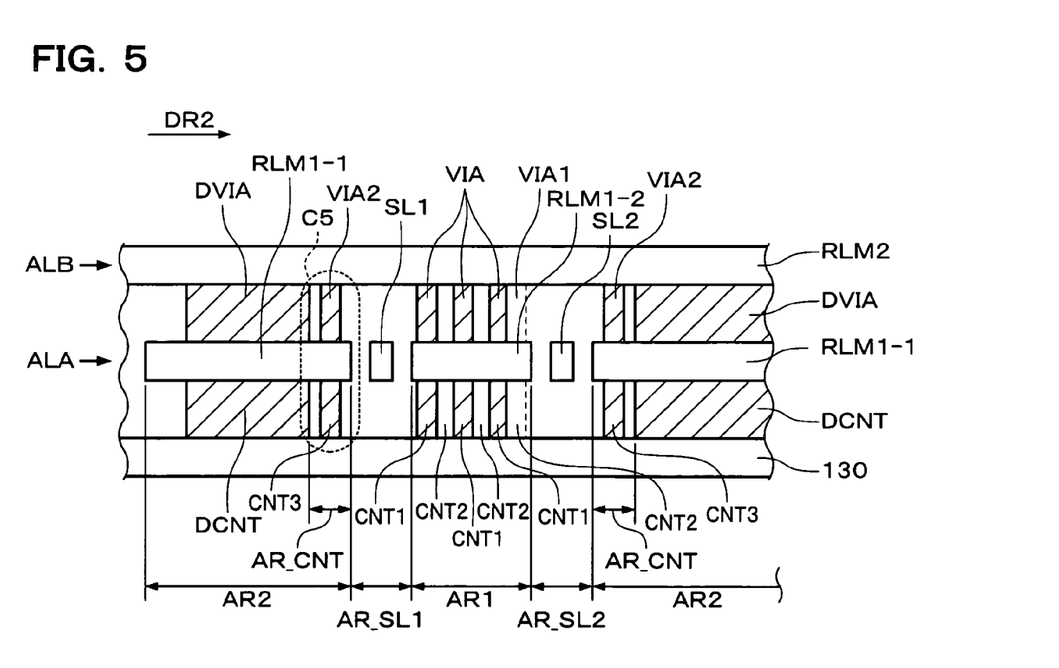
FIG. 5 is another diagram showing a modification according to one embodiment of the invention.

FIG. 5 is a side view of the modification shown in FIG. 4 in the direction DR1. FIG. 5 shows the cross sections of the signal lines SL1 and SL2. The staggered contact formation region AR_CNT (staggered via contact formation region) is provided in the end region of the second region AR2 in the direction DR2, for example. A plurality of contacts CNT3 are formed in the staggered contact formation region AR_CNT on the substrate 130. The light-blocking metal interconnect RLM1-1 is formed in the first metal interconnect layer ALA in the layer on the contacts CNT3. A plurality of via contacts VIA2 are formed in the staggered via contact formation region in the upper layer of the first metal interconnect layer ALA.

The contacts CNT3 and the via contacts VIA2 can be formed by providing the staggered contact formation region AR_CNT and the staggered via contact formation region in the second region AR2, as indicated by C5 in FIG. 5, for example. Therefore, the light-blocking properties in the area C5 can be improved.

In this embodiment and the modification, the contacts CNT and CNT3 and the via contacts VIA and VIA1 are formed. Note that any of the contacts CNT and CNT3 and the via contacts VIA and VIA1 may be omitted.

2. Layout

Figure 6:
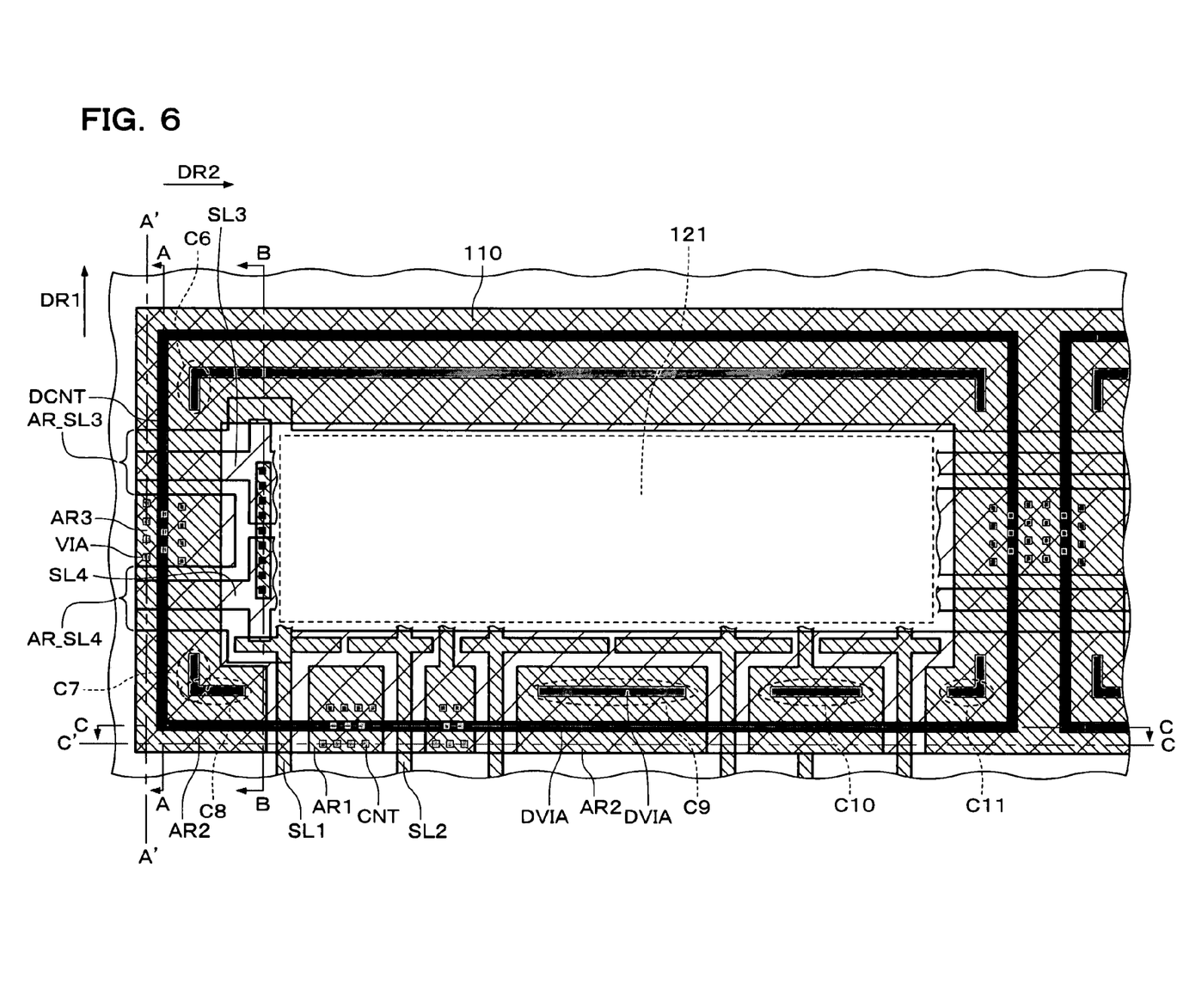
FIG. 6 is a diagram showing the layout of a part of the semiconductor device according to one embodiment of the invention.

FIG. 6 is a diagram showing the layout of the semiconductor device 100 according to this embodiment. The semiconductor element 120 is formed in a light-blocking target region 121. In FIG. 6, the layout inside the light-blocking target region 121 is omitted for convenience of description. A non-volatile memory including a floating gate may be formed as the semiconductor element 120, for example. FIG. 6 shows the layout of the semiconductor device 100 for the layer in which the contact CNT is formed, the first metal interconnect layer ALA, the layer in which the via contact VIA is formed, and the second metal interconnect layer ALB.

As shown in FIG. 6, a third signal line SL3 and a fourth signal line SL4 may be connected with the semiconductor element 120. In this case, a third signal line pull-out region AR_SL3 and a fourth signal line pull-out region AR_SL4 for pulling out the third and fourth signal lines SL3 and SL4 are provided in the light-blocking region 110. The third and fourth signal lines SL3 and SL4 are formed in an interconnect layer differing from the interconnect layer in which the first and second signal lines SL1 and SL2 are formed. Note that the invention is not limited thereto.

Figure 7:
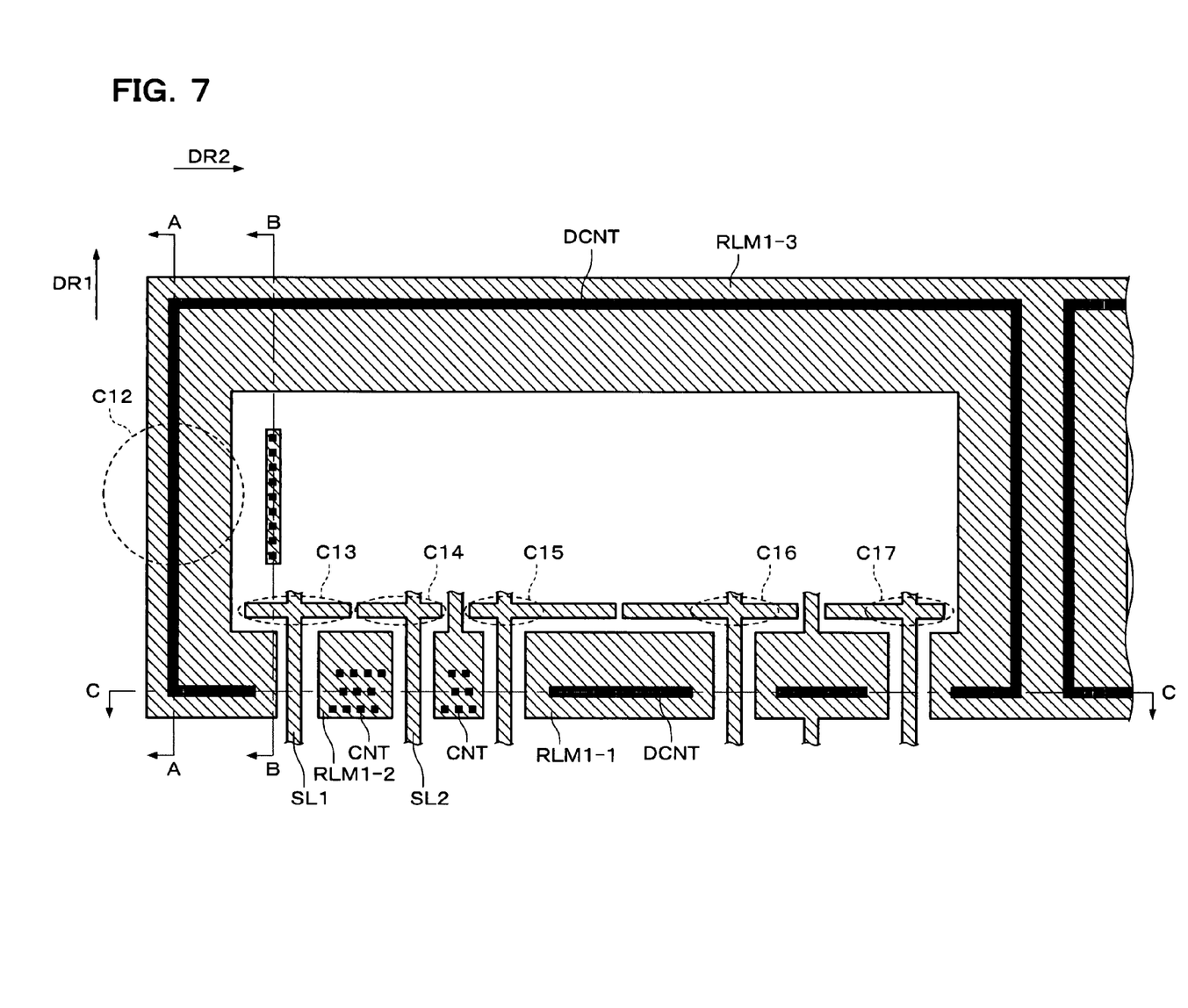
FIG. 7 is a diagram showing the layout of some layers in the layout shown in FIG. 6.

FIG. 7 is a diagram showing the layout of the contact CNT, the linear contact DCNT, and the metal interconnect formed in the first metal interconnect layer ALA in the layout shown in FIG. 6. In the first region AR1, the contacts CNT are disposed in a staggered arrangement, and the light-blocking metal interconnect RLM1-2 is formed in the first metal interconnect layer ALA in the upper layer of the contacts CNT. In the second region AR2, the linear contact DCNT is formed, and the light-blocking metal interconnects RLM1-1 and RLM1-3 (first light-blocking metal interconnects in a broad sense) are formed in the first metal interconnect layer ALA in the upper layer of the linear contact DCNT, for example.

The first and second signal lines SL1 and SL2 are formed in the first metal interconnect layer ALA, for example. Note that the invention is not limited thereto. For example, three or more signal lines may be formed as shown in FIG. 7. A third region AR3 and the signal line pull-out regions AR_SL3 and AR_SL4 shown in FIG. 6 are formed in the upper layer of the region shown in C12.

A part of the signal line SL1 is formed in the shape of the letter "T", as indicated by C13. In more detail, in the region enclosed by the light-blocking region 110, a part of the signal line SL1 (light-blocking signal line in a broad sense) is formed to extend along the direction (e.g. direction DR2)

which intersects the direction in which the signal line SL1 extends (e.g. direction DR1). This also applies to the remaining signal lines as indicated by symbols C14 to C17. A decrease in the light-blocking properties in the signal line pull-out regions AR_SL1 and AR_SL2 can be reduced by forming the signal lines in the shape of the letter "T", for example. For example, when light parallel to the direction DR1 is applied to the semiconductor device 100, a part of the applied light can be blocked in the area C13.

Figure 8:
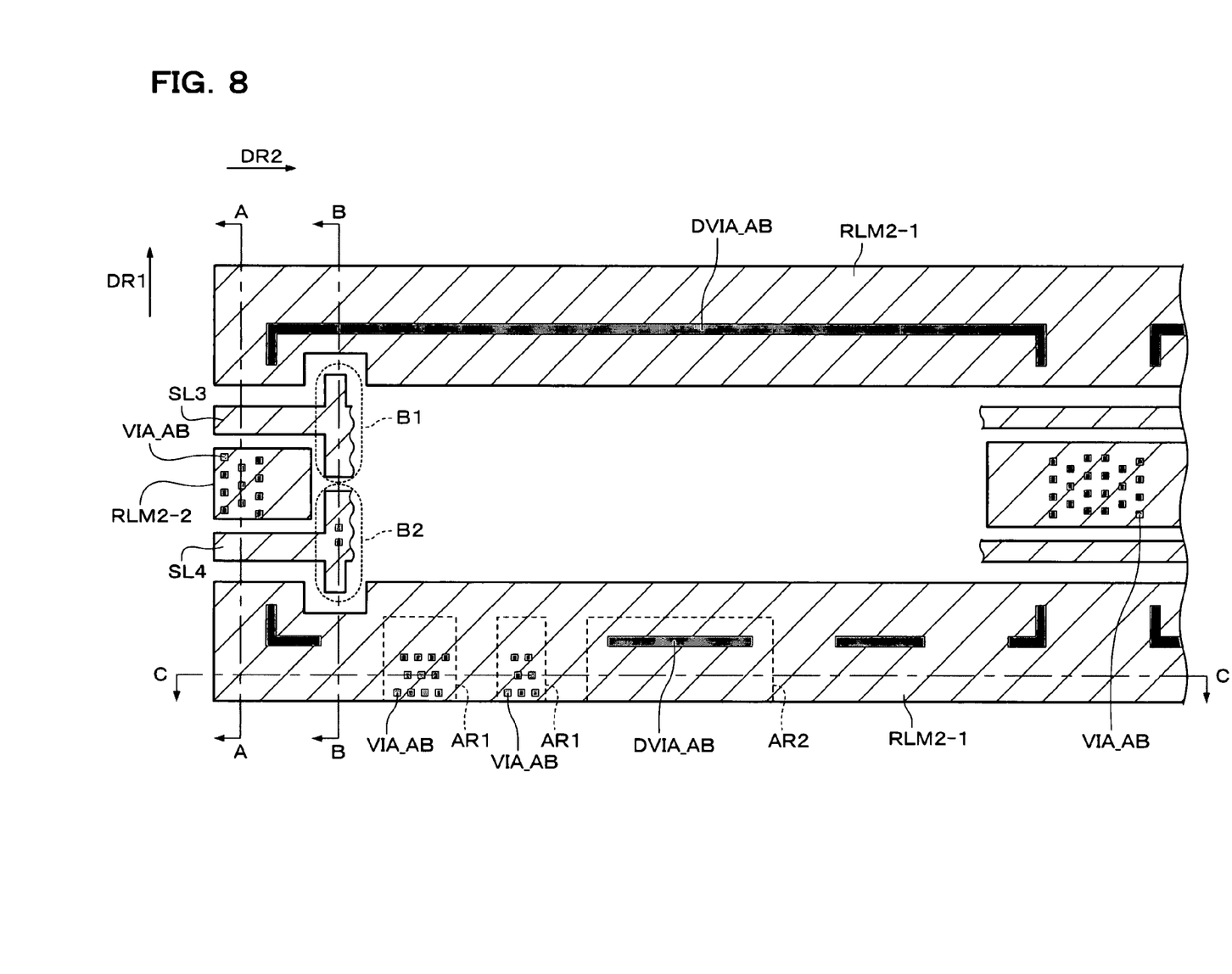
FIG. 8 is another diagram showing the layout of some layers in the layout shown in FIG. 6.

FIG. 8 is a diagram showing the layout of the via contact VIA_AB, the linear via contact DVIA_AB, and the metal interconnect formed in the second metal interconnect layer ALB in the layout shown in FIG. 6. In the first region AR1, the via contacts VIA_AB are disposed in a staggered arrangement, and the light-blocking metal interconnect RLM2-1 (second light-blocking metal interconnect in a broad sense) is formed in the second metal interconnect layer ALB in the upper layer of the via contacts VIA_AB. In the second region AR2, the linear via contact DVIA_AB is formed, and the light-blocking metal interconnect RLM2-1 is formed in the second metal interconnect layer ALB in the upper layer of the linear via contact DVIA_AB, for example.

In the third region AR3 (see FIG. 6) between the third signal line SL3 and the fourth signal line SL4, the via contacts VIA_AB are disposed in a staggered arrangement in the upper layer of the light-blocking metal interconnect RLM1-3 shown in FIG. 7, and the light-blocking metal interconnect RLM2-2 (second light-blocking metal interconnect in a broad sense) is formed in the second metal interconnect layer ALB in the upper layer of the via contacts VIA_AB.

A part of the signal line SL3 is formed in the shape of the letter "T", as indicated by B1. In more detail, in the region enclosed by the light-blocking region 110, a part of the signal line SL3 (light-blocking signal line in a broad sense) is formed to extend along the direction (e.g. direction DR1) which intersects the direction in which the signal line SL3 extends (e.g. direction DR2). This also applies to the signal line SL4 as indicated by B2. A decrease in the light-blocking properties in the signal line pull-out regions AR_SL3 and AR_SL4 can be reduced by forming the signal lines in the shape of the letter "T", for example. For example, when light parallel to the direction DR2 is applied to the semiconductor device 100, a part of the applied light can be blocked in the area B1 or B2.

Figure 9:
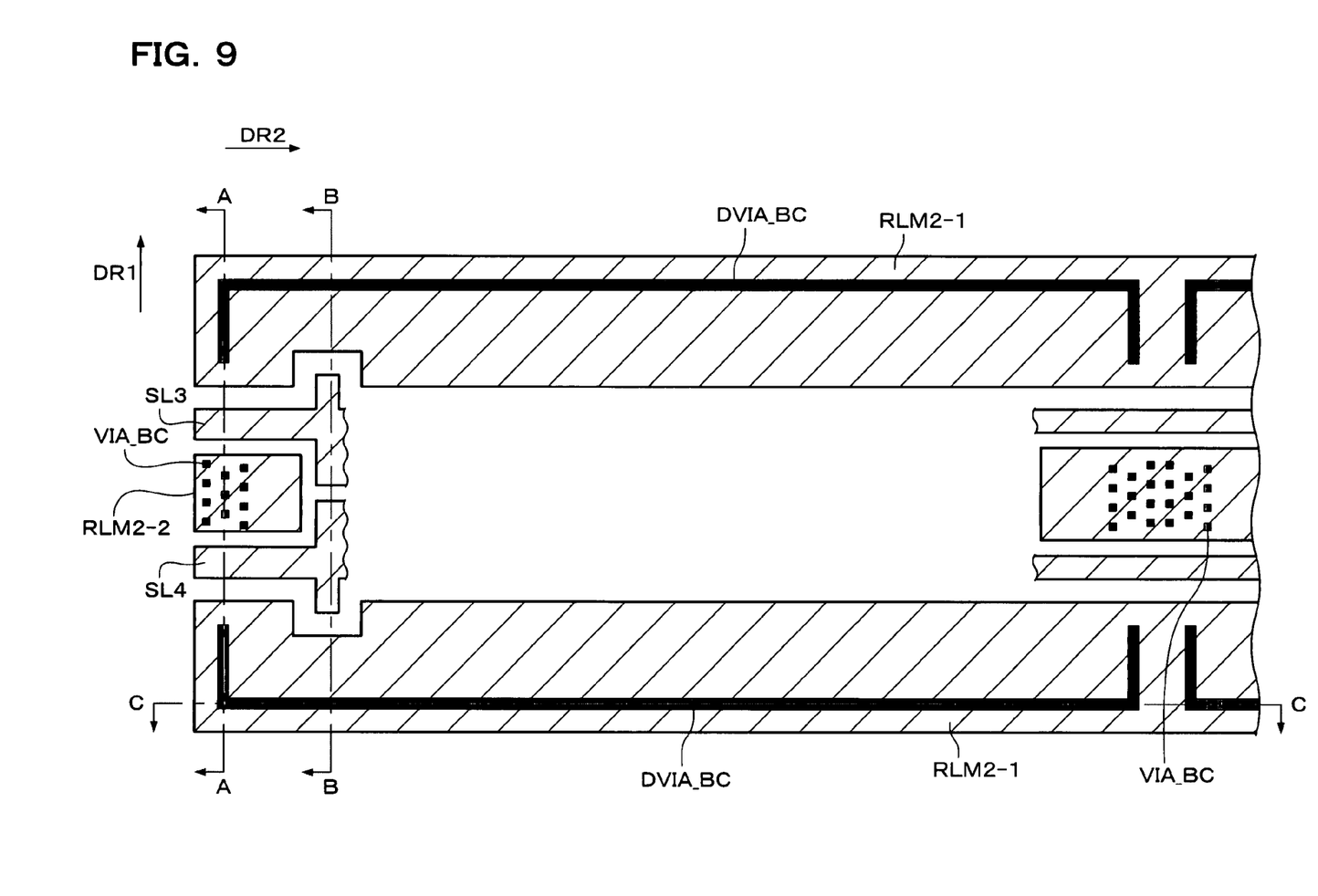
FIG. 9 is yet another diagram showing the layout of some layers in the layout shown in FIG. 6.

FIG. 9 is a diagram showing the layout of the metal interconnect formed in the second metal interconnect layer ALB, a via contact VIA_BC, and a linear via contact DVIA_BC in the layout shown in FIG. 6. The linear via contact DVIA_BC is formed in the upper layer of the light-blocking metal interconnect RLM2-1 in the second metal interconnect layer ALB.

In the third region AR3 between the third signal line SL3 and the fourth signal line SL4 (see FIG. 6), the via contacts VIA_BC are disposed in a staggered arrangement in the upper layer of the light-blocking metal interconnect RLM2-2 in the second metal interconnect layer ALB.

Figure 10:
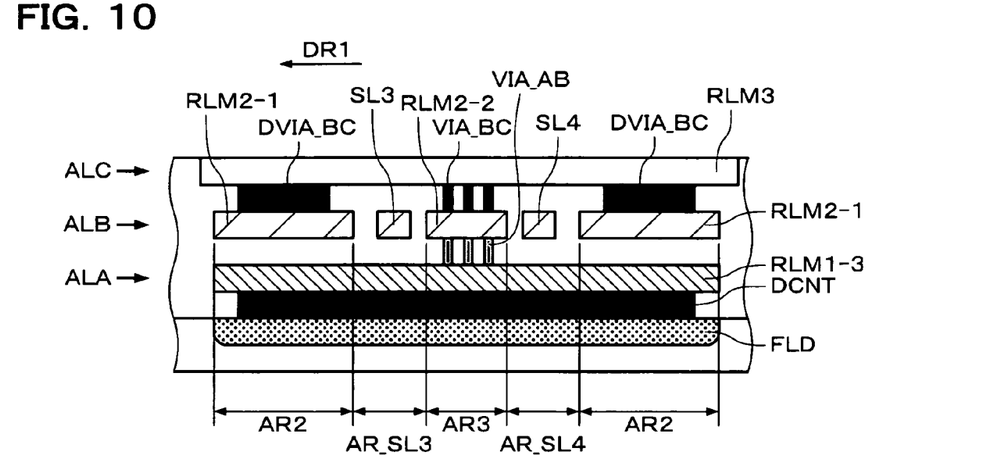
FIG. 10 is a cross-sectional diagram viewed along the line A-A shown in FIG. 6.
Figure 12:
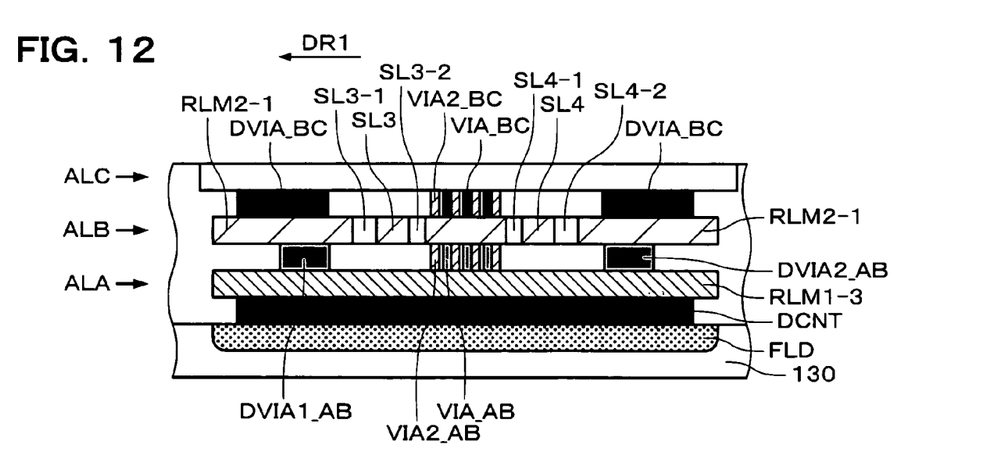
FIG. 12 is a diagram showing the cross section along the line A-A shown in FIG. 6, a linear via contact, and a plurality of via contacts.

FIG. 10 is a cross-sectional diagram viewed along the line A-A shown in FIG. 6. In the third region AR3, the linear contact DCNT is formed in the upper layer of an impurity diffusion layer FLD in the substrate 130, and the light-blocking metal interconnect RLM1-3 is formed in the first metal interconnect layer ALA in the upper layer of the linear contact DCNT. In the third region AR3, the via contacts VIA_AB are formed in the upper layer of the light-blocking metal interconnect RLM1-3, and the light-blocking metal interconnect RLM2-2 is formed in the second metal interconnect layer ALB in the upper layer of the via contacts VIA_AB. In the third region AR3, the via contacts VIA2_AB are formed in the upper layer of the light-blocking metal interconnect RLM1-3, as shown in FIG. 12 (not shown in the cross section along the line A-A). The via contacts VIA2_AB correspond to the via contacts VIA on a line A' shown in FIG. 6. FIG. 12 is a diagram in which the via contact VIA on the line A' in FIG. 6, the areas indicated by C6 and C7 in FIG. 6, and the areas indicated by B1 and B2 in FIG. 8 are added to the cross-sectional diagram shown in FIG. 10.

In the third region AR3, the via contacts VIA_BC are formed in the upper layer of the light-blocking metal interconnect RLM2-2, and the light-blocking metal interconnect RLM3 is formed in the third metal interconnect layer ALC in the upper layer of the via contacts VIA_BC. In the third region AR3, the via contacts VIA2_BC are formed in the upper layer of the light-blocking metal interconnect RLM2-2, as shown in FIG. 12 (not shown in the cross section along the line A-A). The via contacts VIA2_BC correspond to the via contacts VIA on the line A' shown in FIG. 6.

In the second region AR2, the light-blocking metal interconnect RLM1-3 is formed in the first metal interconnect layer ALA in the upper layer of the linear contact DCNT. In the second region AR2, the linear via contact DVIA_AB is formed in the upper layer of the light-blocking metal interconnect RLM1-3, and the light-blocking metal interconnect RLM2-1 is formed in the second metal interconnect layer ALB in the upper layer of the linear via contact DVIA_AB, as shown in FIG. 12 (not shown in the cross section along the line A-A). The linear via contact DVIA_AB shown in FIG. 12 corresponds to the areas indicated by C6 and C7 shown in FIG. 6.

In the second region AR2, the via contacts VIA_BC are formed in the upper layer of the light-blocking metal interconnect RLM2-1, and the light-blocking metal interconnect RLM3 is formed in the third metal interconnect layer ALC in the upper layer of the via contacts VIA_BC.

In the third and fourth signal line pull-out regions AR_SL3 and AR_SL4, the light-blocking metal interconnect RLM1-3 is formed in the upper layer of the linear contact DCNT, and the signal lines SL3 and SL4 are formed in the upper layer of the light-blocking metal interconnect RLM1-3. The signal lines SL3 and SL4 are not electrically connected with the light-blocking metal interconnects RLM2-1 and RLM2-2, as shown in FIG. 10. Note that the invention is not limited thereto.

Figure 11:
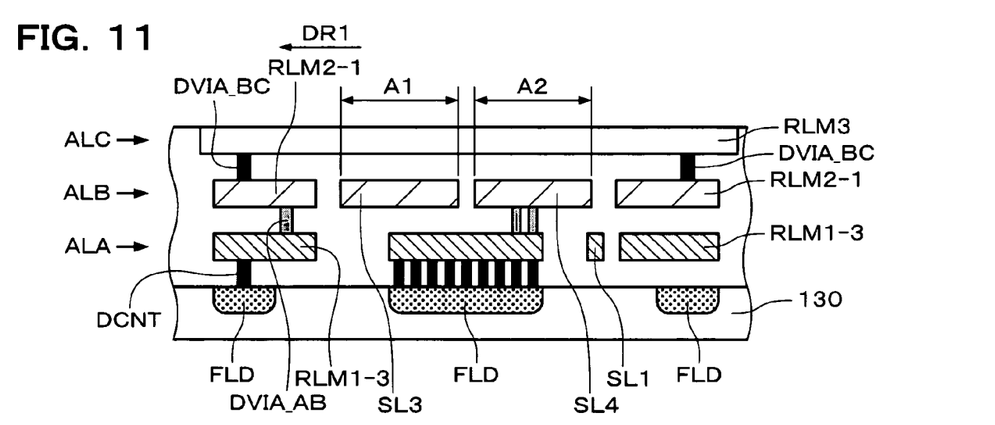
FIG. 11 is a cross-sectional diagram viewed along the line B-B shown in FIG. 6.

FIG. 11 is a cross-sectional diagram viewed along the line B-B shown in FIG. 6. As indicated by A1 and A2 in FIG. 11, a part of each of the signal lines SL3 and SL4 is formed to extend along the direction DR1. This allows light to be blocked in the areas indicated by SL3-1, SL3-2, SL4-1, and SL4-2 in FIG. 12. The signal line SL1 shown in FIG. 11 corresponds to the area indicated by C13 in FIG. 7.

Figure 13:
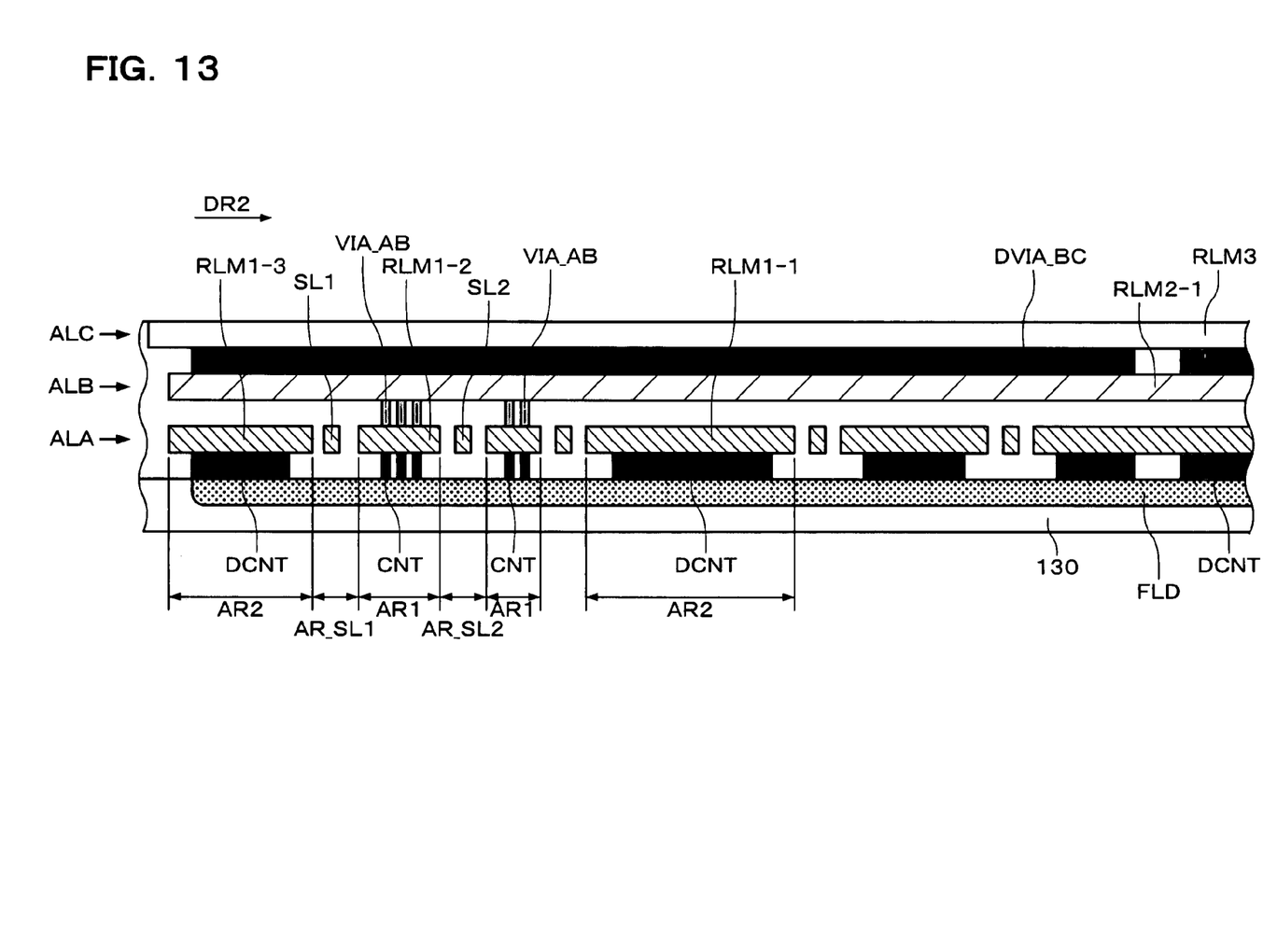
FIG. 13 is a cross-sectional diagram viewed along the line C-C shown in FIG. 6.

FIG. 13 is a cross-sectional diagram viewed along the line C-C shown in FIG. 6. In the first region AR1, the contacts CNT are formed in the upper layer of the impurity diffusion layer FLD in the substrate 130, and the light-blocking metal interconnect RLM1-2 is formed in the first metal interconnect layer ALA in the upper layer of the contacts CNT. In the first region AR1, the contacts CNT are formed in the upper layer of the impurity diffusion layer FLD (not shown in the cross section along the line C-C). The contacts CNT correspond to the contacts CNT on a line C' shown in FIG. 6.

In the first region AR1, the via contacts VIA_AB are formed in the upper layer of the light-blocking metal interconnect RLM1-2, and the light-blocking metal interconnect RLM2-1 is formed in the second metal interconnect layer ALB in the upper layer of the via contacts VIA_AB. In the first region AR1, the via contacts VIA_AB are formed in the upper layer of the light-blocking metal interconnect RLM1-2 (not shown in the cross section along the line C-C). The via contacts VIA_AB correspond to the via contacts VIA on the line C' shown in FIG. 6.

In the first region AR1, the linear via contact DVIA_BC is formed in the upper layer of the light-blocking metal interconnect RLM2-1, and the light-blocking metal interconnect RLM3 is formed in the third metal interconnect layer ALC in the upper layer of the linear via contact DVIA_BC.

Figure 14:
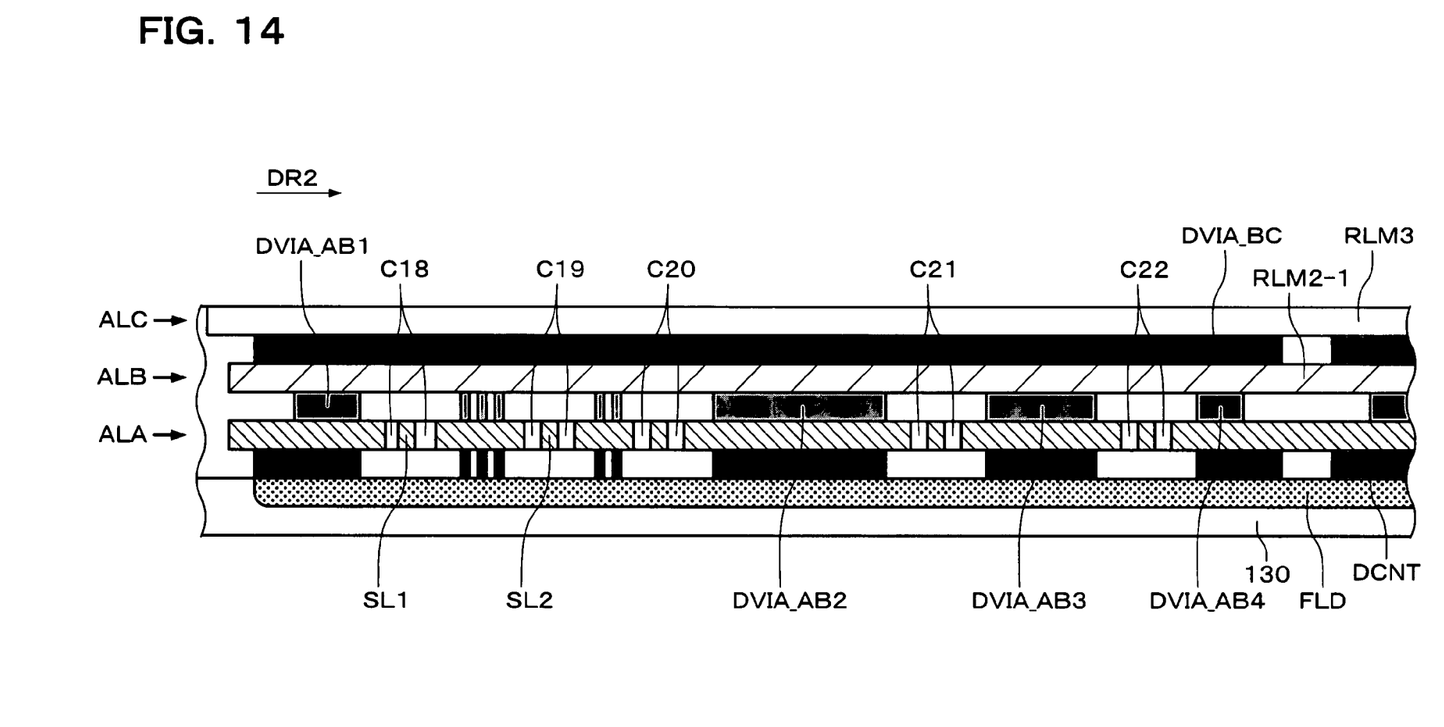
FIG. 14 is a diagram showing the cross section along the line C-C shown in FIG. 6, a linear via contact, and a plurality of via contacts.

In the second region AR2, the light-blocking metal interconnect RLM1-1 or RLM1-3 is formed in the first metal interconnect layer ALA in the upper layer of the linear contact DCNT. In the second region AR2, the linear via contact DVIA_AB2 is formed in the upper layer of the light-blocking metal interconnect RLM1-1, and the light-blocking metal interconnect RLM2-1 is formed in the second metal interconnect layer ALB in the upper layer of the linear via contact DVIA_AB2, as shown in FIG. 14 (not shown in the cross section along the line C-C). The linear via contact DVIA_AB2 corresponds to the area indicated by C9 in FIG. 6. As shown in FIG. 14, the linear via contact DVIA_AB1 is formed in the upper layer of the light-blocking metal interconnect RLM1-3, and the light-blocking metal interconnect RLM2-1 is formed in the second metal interconnect layer ALB in the upper layer of the linear via contact DVIA_AB1. The linear via contact DVIA_AB1 corresponds to the area indicated by C8 in FIG. 6.

FIG. 14 is a diagram in which the areas indicated by C8, C9, C10, and C11 in FIG. 6 and the areas indicated by C13, C14, C15, C16, and C17 in FIG. 7 are added to the cross-sectional diagram shown in FIG. 13. The area indicated by C18 in FIG. 14 corresponds to the area indicated by C13 in FIG. 7, and the area indicated by C19 in FIG. 14 corresponds to the area indicated by C14 in FIG. 7. The areas indicated by C20, C21, and C22 in FIG. 14 respectively correspond to the areas indicated by C15, C16, and C17 in FIG. 7.

In the second region AR2, the linear via contact DVIA_BC is formed in the upper layer of the light-blocking metal interconnect RLM2-1, and the light-blocking metal interconnect RLM3 is formed in the third metal interconnect layer ALC in the upper layer of the linear via contact DVIA_BC.

In the first and second signal line pull-out regions AR_SL1 and AR_SL2, the signal lines SL1 and SL2 are formed in the upper layer of the impurity diffusion layer FLD. The signal lines SL1 and SL2 are not electrically connected with the light-blocking metal interconnects RLM1-1, RLM1-2, and RLM1-3, as shown in FIG. 13. Note that the invention is not limited thereto.

Since a part of each of the signal lines SL1 and SL2 is formed to extend along the direction DR2, light can be blocked in the area indicated by C18 or C19 in FIG. 14, for example. This enables the light-blocking efficiency in the signal line pull-out region to be improved. The same effect is obtained by the areas indicated by C20 to C22 in FIG. 14.

The light-blocking metal interconnect RLM3 is formed to cover the light-blocking region 110 and the semiconductor element 120 shown in FIG. 1, for example. In FIG. 6, the light-blocking region 110 and the semiconductor element 120 are omitted for convenience of description. The upper side of the semiconductor element 120 can be blocked by the light-blocking metal interconnect RLM3.

3. Comparison with Comparative Example and Effects 3.1. Design Rule

Figure 15:
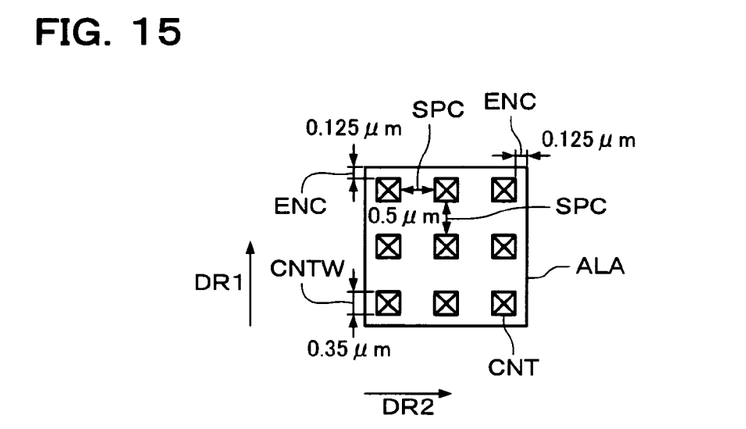
FIG. 15 is a diagram showing a contact design rule.

FIG. 15 is a diagram showing the minimum enclosure length between the contact CNT and the metal interconnect formed in the first metal interconnect layer ALA. A space SPC indicates the minimum space length between the contacts CNT, which is set at 0.5 μm, for example. An enclosure ENC indicates the minimum enclosure length between the contact CNT and the metal interconnect in the metal interconnect layer ALA, which is set at 0.25 μm, for example. The width CNTW of the contact CNT in the direction DR1 is set at 0.35 μm, for example.

Figure 16A:
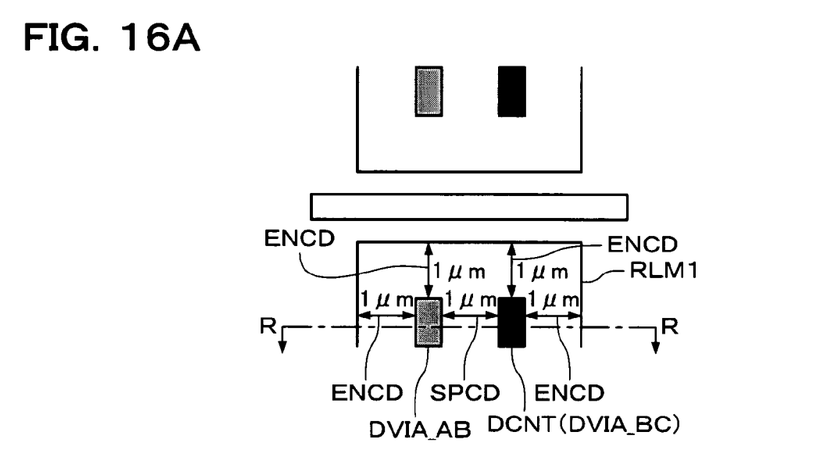
FIGS. 16A and 16B are diagrams showing a design rule of a linear contact.

As shown in FIG. 16A, the minimum enclosure length of the linear contact DCNT is longer than the minimum enclosure length of the contact CNT.

As shown in FIG. 16A, an enclosure ENCD indicates the minimum enclosure length between the linear contact DCNT and the metal interconnect RLM1 in the metal interconnect layer ALA, which is set at 1 μm, for example. A space SPCD indicates the minimum space length between the linear contact DCNT and the linear via contact VIA_AB, which is set at 1 μm, for example.

The enclosure ENCD and the space SPCD are respectively set to be greater than the enclosure ENC and the space SPC. In the area in which the linear contact DCNT is formed, since the width of this area is increased in the direction in which the linear contact DCNT extends, it is necessary to increase the enclosure ENCD.

Figure 16B:
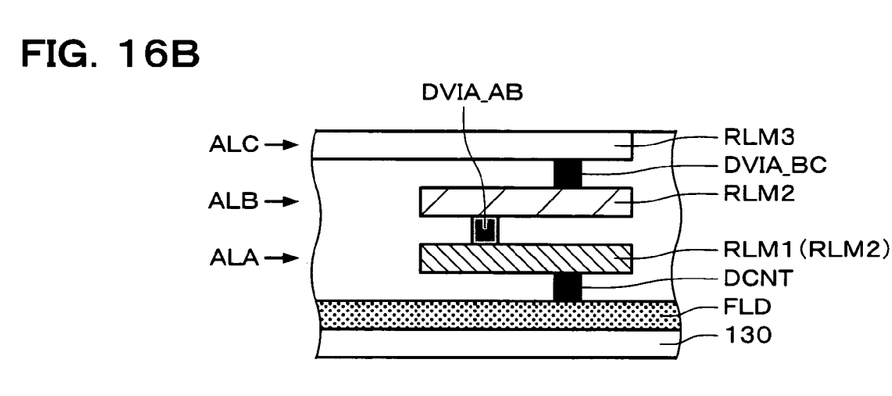

FIG. 16B is a cross-sectional diagram viewed along the line R-R shown in FIG. 16A. As shown in FIG. 16B, the linear contact DCNT, the linear via contact DVIA_AB, and the linear via contact DVIA_BC are formed at an interval corresponding to the space SPCD. For example, the metal interconnect layer ALA in the upper layer is dented in the area in which the linear contact DCNT is formed. Therefore, the linear via contact DVIA_AB in the upper layer of the metal interconnect layer ALA is formed at an interval corresponding to the space SPCD from the formation position of the linear contact DCNT. The formation position of the linear via contact DVIA_BC is provided at an interval corresponding to the space SPCD from the formation position of the linear via contact DVIA_AB for the same reason. The design rule is created taking the above-described issue into consideration.

Although FIGS. 15 and 16 show the contact CNT, the linear contact DCNT, and the metal interconnect layer ALA, the same description also applies to the via contact VIA, the linear via contact DVIA, and the metal interconnect layers ALB and ALC.

3.2. Comparative Example

Figure 17:
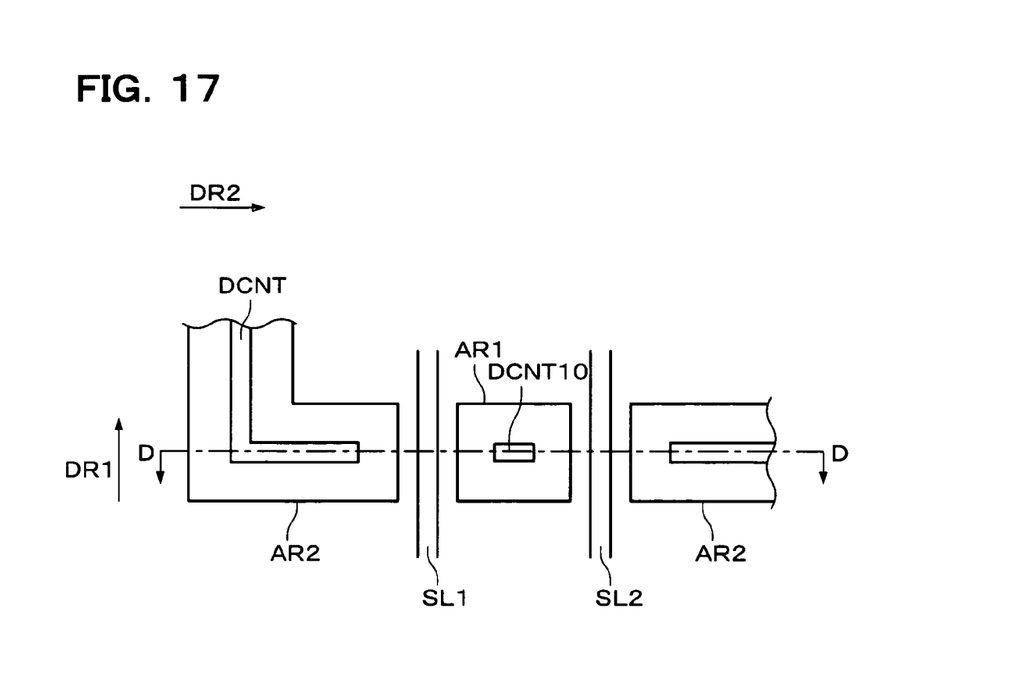
FIG. 17 is a diagram showing a comparative example according to one embodiment of the invention.

FIG. 17 is a diagram showing a comparative example according to this embodiment. In the comparative example, a linear contact DCNT10 is formed in the first region AR1.

Figure 18:
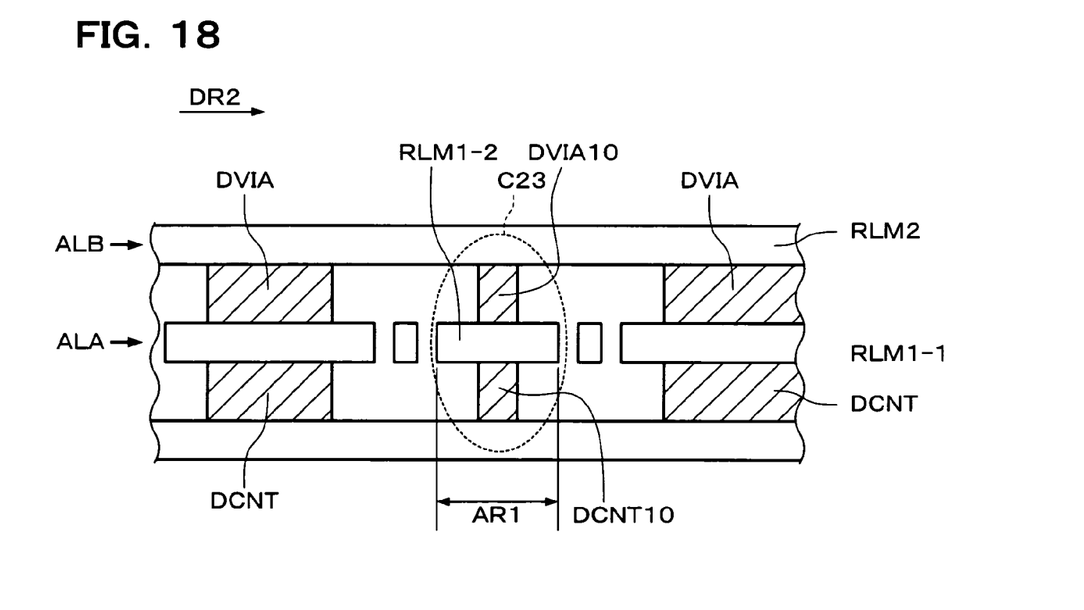
FIG. 18 is another diagram showing the comparative example according to one embodiment of the invention.

FIG. 18 is a cross-sectional diagram viewed along the line D-D shown in FIG. 17. The light-blocking metal interconnect RLM1-2 is formed in the first metal interconnect layer ALA in the upper layer of the linear contact DCNT10, and a linear via contact DVIA10 is formed in the upper layer of the light-blocking metal interconnect RLM1-2.

In this case, the width of the linear contact DCNT10 in the direction DR2 is smaller than the width of the first region AR1 in the direction DR2, as indicated by C23, whereby the light-blocking efficiency is decreased. This occurs due to the design rule. The enclosure ENCD is necessary for the linear contact DCNT with respect to the light-blocking metal interconnect RLM1-2. The enclosure ENCD is larger than the enclosure ENC of the contact CNT. Therefore, a large space is formed in the area indicated by C23.

In this embodiment, the contacts CNT and the via contacts VIA are disposed in a staggered arrangement in the first region AR1, as shown in FIGS. 2 and 3, for example. Since the enclosure ENC and the space SPC of the contact CNT and the via contact VIA are small as described above, the light-blocking efficiency in the first region AR1 can be improved, for example.

In the case where the signal line pull-out regions are provided in the light-blocking region 110 as shown in FIG. 1, if the distance between two signal lines is small, the light-blocking efficiency is decreased when forming the linear contact DCNT and the linear via contact DVIA in the region between the two signal lines. In this embodiment, when the distance between two signal lines is small, the light-blocking efficiency can be improved by disposing the contacts CNT and the via contacts VIA in a staggered arrangement in the region between the two signal lines.

On the other hand, when the distance between two signal lines is large, since the linear contact DCNT and the linear via contact DVIA can be formed in the region between the two signal lines, the light-blocking efficiency can be improved. Specifically, this embodiment allows the option of selecting either the formation of the linear contact DCNT and the linear via contact DVIA or the disposition of the contacts CNT and the via contacts VIA in a staggered arrangement depending on the width of the light-blocking region in the direction DR1, for example. Therefore, the light-blocking structure for preventing the incidence of light on the semiconductor element 120 can be formed by efficiently combining the linear contact DCNT and the linear via contact DVIA with the contacts CNT and the via contacts VIA disposed in a staggered arrangement.

As a comparative example, the entire light-blocking region 110 may be formed using the contacts CNT and the via contacts VIA disposed in a staggered arrangement. In this case, since the area of the light-blocking region 110 must be increased in comparison with the case of forming the light-blocking region 110 using the linear contact DCNT and the linear via contact DVIA in order to obtain a desired light-blocking efficiency, the chip area of the semiconductor device 100 is not efficiently utilized. This hinders a reduction in manufacturing cost.

In this embodiment, since the linear contact DCNT and the linear via contact DVIA and the contacts CNT and the via contacts VIA disposed in a staggered arrangement are formed in combination, the area of the light-blocking region 110 can be reduced. Therefore, the chip area of the semiconductor device 100 can be efficiently utilized, whereby the manufacturing cost can be reduced.

In this embodiment, the linear contact DCNT, the light-blocking metal interconnect RLM1-3, the via contacts VIA_AB disposed in a staggered arrangement, the light-blocking metal interconnect RLM2-2, and the via contacts VIA_BC disposed in a staggered arrangement are formed in the third region AR3, as shown in FIG. 10. According to this embodiment, the light-blocking efficiency in the third region AR3 can be improved by forming such elements in the third region AR3.

In this embodiment, since a part of each of the third and fourth signal lines SL3 and SL4 is formed to extend along the direction DR1 as shown in FIG. 11, light can be blocked in the areas SL3-1, SL3-2, SL4-1, and SL4-2 shown in FIG. 12. Therefore, the light-blocking efficiency in the third and fourth signal line pull-out regions AR_SL3 and AR_SL4 can be improved.

In this embodiment, since a part of each of the signal lines (including the first and second signal lines SL1 and SL2) is formed to extend along the direction DR2 as indicated by C13 to C17 in FIG. 7, light can be blocked in the areas C18 to C22 shown in FIG. 14. Therefore, the light-blocking efficiency in each signal line pull-out region including the first and second signal line pull-out regions AR_SL1 and AR_SL2 can be improved.

In this embodiment, the contacts CNT disposed in a staggered arrangement, the light-blocking metal interconnect RLM1-2, the via contacts VIA_AB disposed in a staggered arrangement, the light-blocking metal interconnect RLM2-1, and the linear via contact DVIA_BC are formed in the first region AR1, as shown in FIG. 13. According to this embodiment, the light-blocking efficiency in the first region AR1 can be improved by forming such elements in the first region AR1.

The embodiments of the invention are described above in detail. Those skilled in the art would readily appreciate that various modifications are possible in the embodiments without materially departing from the novel teachings and the advantages of the invention. Accordingly, such modifications are intended to be included within the scope of the invention. Any term cited with a different term having a broader meaning or the same meaning at least once in the specification and the drawings can be replaced by the different term in any place in the specification and the drawings.

What is claimed is:

1. A semiconductor device comprising:
    a semiconductor element;
    a light-blocking region enclosing the semiconductor element;
    a plurality of contacts disposed in a staggered arrangement in a first region of the light-blocking region; and
    a linear contact formed to extend along at least a first direction in a second region of the light-blocking region differing from the first region,
    a first signal line pull-out region for forming a first signal line connected with the semiconductor element and a second signal line pull-out region for forming a second signal line connected with the semiconductor element being formed in the light-blocking region, and
    the first region in which the plurality of contacts are disposed in a staggered arrangement being provided between the first signal line pull-out region and the second signal line pull-out region.

2. The semiconductor device as defined in claim 1, the first signal line pull-out region or the second signal line pull-out region being provided in a region between the first region and the second region.

3. The semiconductor device as defined in claim 1, a width of the second region in the first direction being greater than a width of the first region in the first direction.

4. The semiconductor device as defined in claim 1, a staggered contact formation region in which a plurality of contacts are disposed in a staggered arrangement being provided on an end of the second region.

5. The semiconductor device as defined in claim 1,
    a third signal line pull-out region for forming a third signal line connected with the semiconductor element and a fourth signal line pull-out region for forming a fourth signal line connected with the semiconductor element being formed in the light-blocking region, and
    a third region in which the linear contact is formed being provided between the third signal line pull-out region and the fourth signal line pull-out region.

6. The semiconductor device as defined in claim 5,
    a first light-blocking metal interconnect being formed in a first metal interconnect layer in an upper layer of the linear contact in the third region, and the plurality of via contacts being disposed in a staggered arrangement in an upper layer of the first light-blocking metal interconnect in the third region.

7. The semiconductor device as defined in claim 6,
a second light-blocking metal interconnect being formed in a second metal interconnect layer in an upper layer of the plurality of via contacts in the third region, and
a plurality of second via contacts being disposed in a staggered arrangement in an upper layer of the second light-blocking metal interconnect in the third region.

8. The semiconductor device as defined in claim 7, the third and fourth signal lines being formed in the second metal interconnect layer and being not electrically connected with the second light-blocking metal interconnect.

9. A semiconductor device comprising:
a semiconductor element;
a light-blocking region enclosing the semiconductor element;
a plurality of contacts disposed in a staggered arrangement in a first region of the light-blocking region;
a linear contact formed to extend along at least a first direction in a second region of the light-blocking region differing from the first region;
a plurality of via contacts formed in an upper layer of the plurality of contacts in the first region; and
a linear via contact formed to extend along the first direction in an upper layer of the linear contact in the second region,
the plurality of via contacts being disposed in a staggered arrangement in the first region.

10. The semiconductor device as defined in claim 9, a first light-blocking metal interconnect being formed in the first and second regions in a first metal interconnect layer, the first metal interconnect layer being the upper layer of the plurality of contacts and the linear contact, and the first metal interconnect layer being a lower layer of the plurality of via contacts and the linear via contact.

11. The semiconductor device as defined in claim 10,
a second light-blocking metal interconnect being formed in the first region in a second metal interconnect layer in an upper layer of the plurality of via contacts, and
a linear via contact being formed in an upper layer of the second light-blocking metal interconnect in the first region.

12. The semiconductor device as defined in claim 10,
a second light-blocking metal interconnect being formed in the second region in a second metal interconnect layer in an upper layer of the linear via contact, and
a linear via contact being formed in an upper layer of the second light-blocking metal interconnect.

13. The semiconductor device as defined in claim 10, the first and second signal lines connected with the semiconductor element being formed in the first metal interconnect layer and being not electrically connected with the first light-blocking metal interconnect.

14. The semiconductor device as defined in claim 9, a staggered via contact formation region in which the plurality of via contacts are disposed in a staggered arrangement being provided on an end of the second region.

* * * * *